United States Patent
Wang et al.

(10) Patent No.: US 7,434,148 B2
(45) Date of Patent: *Oct. 7, 2008

(54) TRACK BUFFER IN A PARALLEL DECODER

(75) Inventors: Bo Wang, North Potomac, MD (US); Adrian R. Macias, Oceanside, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 213 days.

This patent is subject to a terminal disclaimer.

(21) Appl. No.: 11/024,805

(22) Filed: Dec. 30, 2004

(65) Prior Publication Data

US 2006/0150058 A1 Jul. 6, 2006

(51) Int. Cl.
*H03M 13/03* (2006.01)
(52) U.S. Cl. .................. 714/794; 714/795; 714/755
(58) Field of Classification Search ............... 714/794, 714/795, 786, 792, 755, 772, 718, 54; 375/295
See application file for complete search history.

(56) References Cited

U.S. PATENT DOCUMENTS

| | | | |
|---|---|---|---|
| 5,881,075 A | 3/1999 | Kong et al. | |
| 6,256,339 B1 | 7/2001 | Kaewell, Jr. | |
| 6,690,741 B1 * | 2/2004 | Larrick et al. | 375/295 |
| 6,792,571 B2 * | 9/2004 | Shieh | 714/795 |
| 6,813,744 B1 * | 11/2004 | Traeber | 714/795 |
| 2004/0161064 A1 * | 8/2004 | Brethour et al. | 375/347 |

OTHER PUBLICATIONS

Notification Concerning Transmittal (1 pp.) and International Preliminary Report on Patentability (Chapter 1 of the Patent Cooperation Treaty) dated Nov. 1, 2007 in corresponding PCT application No. PCT/US2005/045544 (4 pp.).
Notification Concerning Transmittal of International Search Report and the Written Opinion of the International Searching Authority, or the Declaration dated Oct. 3, 2007 in corresponding PCT application No. PCT/US05/45544.

* cited by examiner

*Primary Examiner*—Jacques Louis-Jacques
*Assistant Examiner*—Fritz Alphonse
(74) *Attorney, Agent, or Firm*—Posz Law Group, PLC

(57) ABSTRACT

A method (700) and apparatus (600) are described for performing $2^{M-1}$ parallel ACS operations to generate $2^M$ path metric outputs and buffering the $2^M$ path metric outputs in connection with a track buffer (112) in an Ultrawide Bandwidth (UWB) receiver for decoding a message sequence encoded according to a convolutional code. Contents of the track buffer are updated in accordance with Register Exchange and outputs from the track buffer can further be input to a voting unit (114) where a voting scheme can be applied and a decision rendered as to the originally transmitted message sequence.

16 Claims, 5 Drawing Sheets

851, 852, 853, 854, 855, 856, 857, 858

US 7,434,148 B2

TRACK BUFFER IN A PARALLEL DECODER

CROSS-REFERENCE TO RELATED APPLICATIONS

The present invention is related to co-pending applications entitled "PARALLEL DECODER FOR ULTRAWIDE BANDWIDTH RECEIVER," filed Dec. 30, 2004, and Ser. No. 10/024,804 and "DECISION VOTING IN A PARALLEL DECODER," filed Dec. 30, 2004, and Ser. No. 11/024,803, the contents of both of which are hereby incorporated by reference in their entirety.

FIELD OF THE INVENTION

The present invention relates in general to wireless communication systems, such as ultrawide bandwidth (UWB) systems, including UWB receivers, mobile receivers and transceivers, centralized receivers and transceivers, and related equipment. More specifically, the present invention relates to a track buffer for storing path metric calculations in a parallel decoder used in such devices.

BACKGROUND OF THE INVENTION

As ultrawide bandwidth (UWB) communication becomes increasingly desirable for wireless devices due to its speed and capacity combined with its resilience to interference within high-frequency bands, it is increasingly necessary to adopt effective error correction and related coding methods for maintaining step with the high accuracy demands associated with UWB communication. It should be noted that a UWB signal may be defined, in accordance with, for example, The Federal Communications Commission "First Report and Order, Revision of Part 15 of the Commission's Rules Regarding Ultra-Wideband Transmission Systems," ET Docket 98-153, Feb. 14, 2002 as any signal occupying more than 500 MHz in the unlicensed 3.1-10.6 GHz band and meeting a specified energy spectrum or energy spectral density mask. As with many engineering challenges, two predominant constraints guide design activities associated with a UWB system: application speed and power consumption. To address these concerns, various coding schemes can be used to optimize speed and error resiliency while maintaining power consumption at acceptable levels. Thus coding performance and complexity are of great concern in UWB systems.

Convolutional codes are a common choice for coding a continuous sequence of message symbols and provide useful coding performance for UWB systems. For many reasons, convolutional codes can provide power savings due to inherent characteristics of the code and because the error correcting capabilities of the code reduce the requirement for retransmission which can also contribute greatly to saving power on both the transmitter and receiver sides. As will be appreciated by one of ordinary skill, in a convolutional encoder, one message symbol of k bits can be encoded into one code symbol of n code bits, with k and n typically being small integers and with k<n, resulting in a code with a rate of k/n. A typical encoder can be constructed as a shift register plus a series of n connection groups to n summing nodes which produce an n-bit codeword output based on a message symbol input bit and the contents of the shift register. The constraint length K of the encoder is generally taken to be the length of the encoder shift register plus one. Another common parameter used in describing encoders is M which is taken to mean the number of shift register or memory elements. Thus, in the case of a code with a rate of ½, and a constraint length of M=3 (K=4), a typical convolutional encoder for such a code can be described as, for example, a finite state machine (FSM) with $2^M$, or 8 states.

In a conventional decoder such as a convolutional decoder, maximum likelihood decoder, trellis decoder or the like, used for decoding convolutionally encoded signals, the speed at which at which a codeword can be processed is proportional to the trellis depth, or the number of possible state transitions required to converge on the correct message word. Thus for code symbols received at a code rate $r_n$, a decoding operation must perform fast enough to generate the recovered message symbol at the message symbol rate $r_k$. Since, in a conventional trellis decoder, decisions are made only after the trellis is traversed and the surviving path calculated, the trellis depth can have a large impact on the processing speed required to meet the requirement of generating recovered symbols at the symbol rate. A trellis depths even as short as 2 or 3, double and triple the processing speed required to decode the message symbol at the original message symbol rate leading to unsuitable decoding speeds for high speed transmissions such as transmissions within the UWB symbol rate ranges. Since the trellis depth is a function of the constraint length of the code, and can affect the Forward Error Correction (FEC) capability of the code, along with other desirable features of the code, it would be desirable in the art for a method and apparatus for rapidly decoding a received sequence encoded according to a convolutional code without sacrificing the power savings and other benefits associated with code constraint selection.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

The present invention provides comparatively low complexity, low power consumption and high speed forward error correction (FEC) in UWB receivers through the use of a parallel track buffer for storing and processing results obtained through trellis decoding, such as Viterbi decoding, of a convolutionally encoded message sequence. The track buffer of the present invention operating in connection with a parallel decoder, that is a decoder with parallel connected Add Compare Select (ACS) elements such as described in co-pending application entitled "PARALLEL DECODER FOR ULTRAWIDE BANDWIDTH RECEIVER", and Ser. No. 10/024,804, reduces decoding time and decoding power by eliminating the need to iteratively perform computationally intensive decoder calculations and by maintaining, through register exchange or the like as will be described, surviving path metrics leading to a decision as to the received message symbol or message bit. Thus, decoded message symbols can be generated at or near the symbol rate, taking into account the track buffer latency, an achievement which is not generally possible using alternate designs such as conventional iterative, that is, non-parallel, decoder designs including some designs which purport to be at least partially parallel. The present invention accomplishes fast decoding while maintaining acceptable power levels and error correction performance levels associated with convolutional coding.

Figure 1:
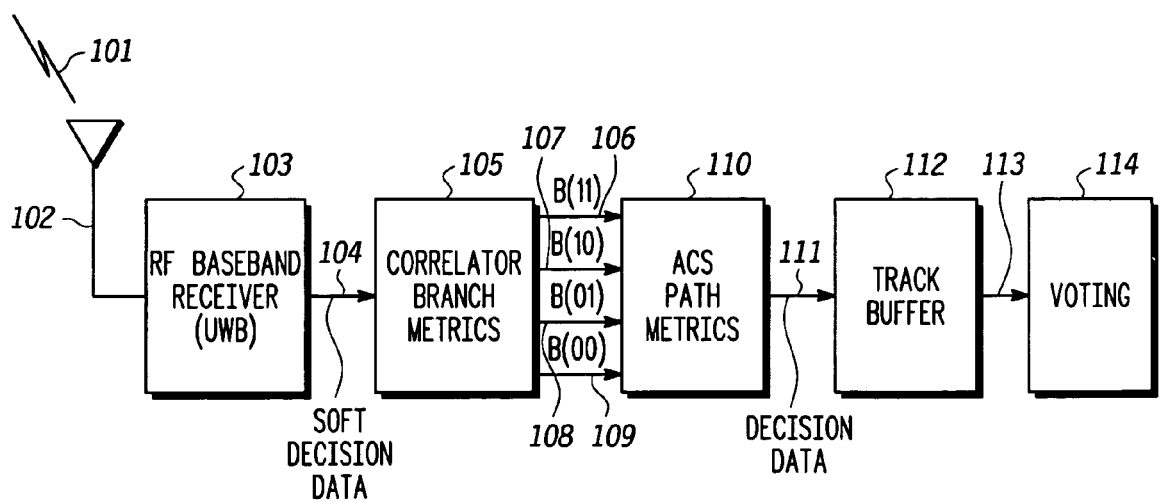
FIG. 1 is a block diagram illustrating blocks associated with an exemplary Ultra Wide Band (UWB) receiver in accordance with various exemplary embodiments of the present invention.

A series of stages in an exemplary receiver 100 is shown in FIG. 1. As will be appreciated by those of ordinary skill in the art, convolutional codes as noted above are generated by subjecting a sequence of message symbols to coding operations in a convolutional encoder (not shown). The convolutional encoder applies n generator polynomials to the message sequence to generate a code word having n symbols for every message symbol. A typical convolutional encoder is configured either in hardware, in software, or in a combination of hardware and software, as a linear shift register with M storage locations and n different sets of connections between n respective summation nodes and various combinations of registers within the shift register corresponding to n respective generator polynomials. Each connection set corresponds to a generator polynomial and is associated with one of the n code symbol outputs associated with code words of the convolutional code. In a ½ rate code, for example, 2 code symbols are generated for every 1 received message symbol and thus 2 sets of connections to the encoder shift register corresponding to the generator polynomials for the code are used to generate the 2 code symbols for each code word.

Each of the unique sets of connections to the input shift register associated with the $n^{th}$ generator are exclusive ORed to form the code symbol for the $n^{th}$ generator and the n code symbols from the n code generators are multiplexed such that n code symbols are generated for every k input symbols at the input symbol rate. Code symbols are transmitted at baseband frequency and received as a UWB signal 101 at an exemplary receiver 100.

As noted above and as shown in Table 1, in accordance with various exemplary embodiments, a message sequence can be encoded with a convolutional code with a rate of ½, and having a constraint length K=6 to achieve a good range performance for various modes. Given a code rate of ½, or a punctured rate of, for example, ¾ for optional modes, the choice of constraint K=6 offers an excellent performance vs. complexity trade-off, requiring, for example, only half the complexity of a code with a constraint K=7. It should incidentally be noted that a convolutional code used in connection with a convolutional interleaver can de-correlate initial demodulator errors, thereby maximizing the FEC benefits associated with the code.

TABLE 1

| Data Rate | FEC Rate | Code Length | Range (AWGN) |
|---|---|---|---|
| 9.2 Mbps | ½ | 24 | 29.3 m |
| 28 Mbps | ½ | 24 | 29.4 m |
| 55 Mbps | ½ | 12 | 22.1 m |
| 110 Mbps | ½ | 6 | 18.3 m |
| 220 Mbps | ½ | 3 | 12.9 m |
| 500 Mbps | ¾ | 2 | 7.3 m |
| 660 Mbps | 1 | 2 | 3 m |
| 1000 Mbps | ¾ | 1 | 5 m |
| 1320 Mbps | 1 | 1 | 2 m |

Table 1 shows supported data rates for low band operation in accordance with various exemplary embodiment of the present invention. The information in Table 1 is based on assumptions for range estimates that include transmit power adjustments for code word spectrum (transmit back-off of 1.2-1.9 dB), 6.6 dB CMOS noise figure for receiver, 2.5 dB implementation loss for data rates up to 220 Mbps (3 dB implementation loss for rates >=500 Mbps) and the like.

The UWB signal 101 can be received at an antenna 102 and input to an RF baseband UWB receiver 103 where soft decision decoding as will be understood to those of skill in the art can be performed on baseband signals associated with the UWB signal 101 to generate soft decision data 104 for input to, for example, a correlator/branch metrics block 105. It will be appreciated that during correlation, branch metrics can be generated identifying the Euclidian distance between the actual received signals and the possible combinations of the 2 prospective received code bits. Thus, four branch metric values associated with the four possible combinations of the two soft decision bits are shown as b(11) 106, b(10) 107, b(01) 108 and b(00) 109 are generated in the correlator/branch metrics block 105 and input with their respective distances or metric values to Add Compare Select (ACS) path metric block 110. It will be appreciated that the branch metric values will be used in the ACS path metric block 110 based on a particular butterfly connection associated with the code parameters. Surviving path metrics are calculated in the individual parallel ACS elements as will be described in greater detail herein after.

When a surviving path metric is selected in a parallel connected ACS element, the metric can be pushed into a series of registers in an exemplary track buffer 112 which is described in greater detail hereinafter. As more information is received, the surviving path metrics can be pushed using register exchange techniques along the surviving path route within the track buffer 112. The contents of the track buffer 112 will converge on a decision regarding the output symbol, that is the symbol regarded by operation of branch metric calculation as the maximum likelihood received symbol. In addition, a voting block 114 which is the subject of the related, co-pending application entitled DECISION VOTING IN A PARALLEL DECODER" and Ser. No. 11/024,803, as noted above, can be configured to operate on the contents of the track buffer 112 and determine an output decision symbol for each received code symbol. It should be noted that while the present invention is directed primarily to track buffering, some aspects of the parallel ACS decoding and voting will be discussed but only, for example, as they relate to track buffering.

Figure 2:
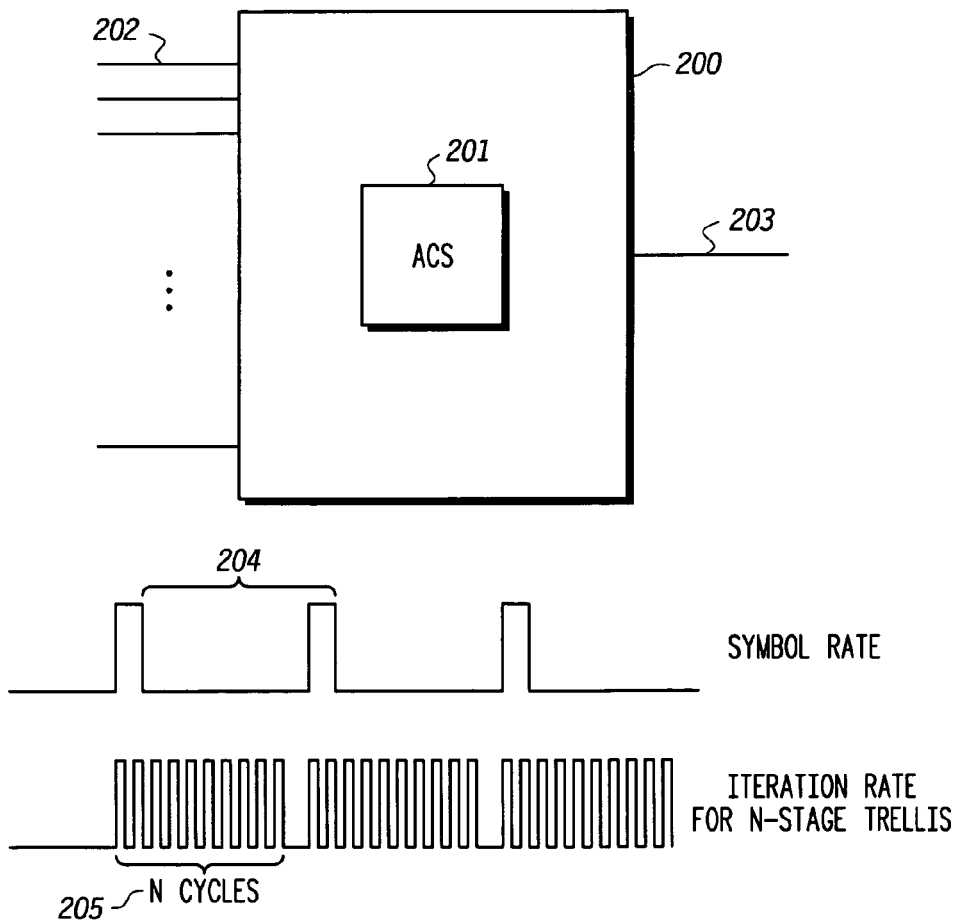
FIG. 2 is a diagram illustrating an exemplary timing relationship between a received symbol rate and iteration rates required for decoding in conventional decoders using Add Compare Select (ACS) elements.

It is important to note that in a conventional trellis decoder, as shown for example in FIG. 2, inputs 202 are applied to a decoder or processor 200 having an iterative ACS path metric calculator 201. A review of the operation of the iterative ACS path metric calculator 201 in comparison to, for example, the output of symbols at output 203, reveals that for symbols output at a symbol rate 204, an n-cycle iteration rate 205 is necessary such that an n-stage trellis can be traversed within the processor 200 in order to generate a decision or output symbol at the symbol rate 204. It can be easily appreciated that for data or symbol rates requiring support under UWB specifications, the n-cycle iteration rate 205 would have to be inordinately fast in order to generate a decision or output symbol at UWB data rates.

It should be noted that while some documents have described so-called parallel processing cores in relation to ACS decoders, such as in connection with the Institute of Electrical and Electronic Engineering P802.15 working group document P802.15-03/213r0r0, entitled "Implementation of High Speed Signal Processing Cores for 15-3a UWB" dated May 10, 2003,these documents fail to describe a complete parallel connected (butterfly connected) series of ACS elements in connection with, for example, a system where constraint K=6,and thus $2^{M-1}$ parallel connected ACS elements can be present such as in accordance with various exemplary embodiments of the present invention and $2^M$ corresponding track buffer elements configured to store the cumulative path metric values output from each of the ACS units and update the contents in accordance with an internal cycle or spin rate based on principals of, for example, register exchange, or the like using information associated with the surviving path or the selected one of the path metric values having, for example, the smallest value.

Trellis Decoding

As will also be appreciated by one of ordinary skill in the art, and as more thoroughly described in the co-pending application "PARALLEL DECODER FOR ULTRAWIDE BANDWIDTH RECEIVER", and Ser. No. 10/024,804, noted above, a trellis diagram is a useful conceptual tool for understanding trellis or Viterbi decoding in accordance with various exemplary embodiments. In a code trellis, rows and columns signify states and stages of operation respectively in accordance with the underlying convolutional code and related FSM. When code words are received, several paths through the trellis can be built using hypothetical state transitions assuming the most likely corresponding message symbol associated with the received code word is a "1" and state transitions assuming the most likely corresponding message symbol is a "0". As noted, the rows of an exemplary trellis represent the $2^M$ code states and the columns represent the stages associated with each subsequent received code word during code word intervals. Just as the convolutional encoder, for an exemplary ½ rate code, encoded 2 code symbols (a code word) for each message symbol input to the encoder shift register, the convolutional decoder will attempt to determine the most likely message symbol corresponding to a received code word by calculating metrics associated with each node in the trellis. As the stages are traversed, distance metrics are accumulated and paths with large metrics are abandoned so that by the "end" of the trellis, that is at the last stage, a path traced back through the trellis will reveal the surviving path and the original message sequence. As noted earlier, in a UWB receiver, waiting until all code words are received is impractical due to the limitations posed by processing speed and symbol rate.

Add Compare Select (ACS)

In traversing an exemplary trellis, or in performing decoding operations various constructs can be used to accomplish the required calculations. One construct which, in conventional systems is used in a non-parallel fashion is an exemplary AddCompare Select (ACS) circuit 300 shown in FIG. 3. It will be appreciated that ACS circuit 300 can be used to implement an exemplary trellis node and in a larger context can be connected in parallel with other ACS elements to form a parallel decoder in accordance with various exemplary embodiments. A path metric value $P_{2j}(t-1)$ at 321 and a path metric value $P_{2j+1}(t-1)$ at 322 can be input to an ADD element 301 and an ADD element 302 respectively. Branch metric values, such as a branch metric value $b_{2j,\,j}(r(t))$ 323 and a branch metric value $b_{2j,\,j+2}^{M-1}(r(t))$ 325 can be input to the ADD element 301 and a branch metric value $b_{2j+1,\,j+2}^{M-1}(r(t))$ 324 and a branch metric value $b_{2j+1,j}(r(t))$ 326 can be input to the ADD element 302 the results of various combinations of calculations for traversed branches can be compared in COMPARE element 303 which can be configured to select using a SELECT line 329 one of a path metric $P_j(t)$ 327 and a path metric $P_{j+2}^{M-1}(t)$ 328 as a surviving path.

Parallel ACS

Although as noted, some discussion exists related to the possible feasibility of processing a limited number of samples such as branch metrics, in parallel (see, IEEE P802.15 Working Group for Wireless Personal Area Networks, (WPANs) document P802.15-03/213r0r0, entitled "Implementation of High Speed Signal Processing Cores for 15-3a UWB, May 10, 2003), none shows specifically how parallel decoding is accomplished, and all fail to describe individual ACS units corresponding to decoder states connected in parallel and an associated track buffer to store or otherwise accumulate information associated with a surviving path, decision, or the like, to reduce the iteration rate to a value at or near the symbol rate. The document further admits the existence of limitations, for example at above 240 Mbps even if a basic parallel decoder could be constructed. Also, given the constraints described in various documents in the art, such as K=7,the complexity levels become undesirable as noted, for example, in the discussion herein above. In stark contrast, using the principals discussed and described herein, a track buffer associated with a parallel trellis decoder can be constructed for providing full symbol rate decoding at 480 Mbps and potentially beyond.

Figure 3:
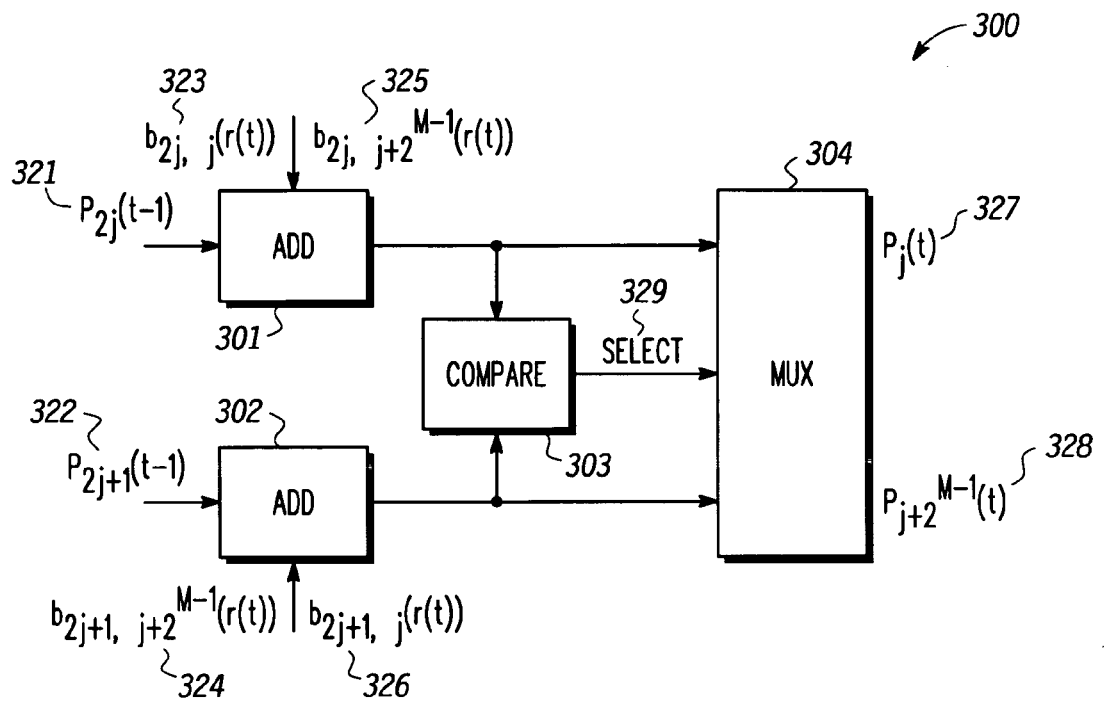
FIG. 3 is a block diagram illustrating inputs to an exemplary Add Compare Select (ACS) element associated with an exemplary trellis node in accordance with various exemplary embodiments of the present invention.
Figure 4:
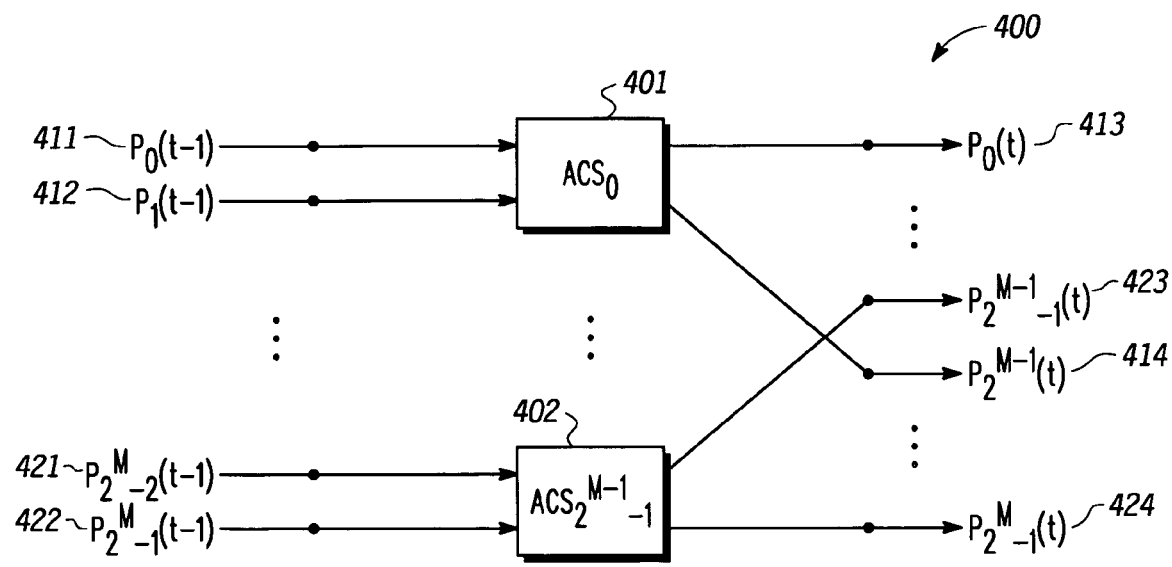
FIG. 4 is a block diagram illustrating exemplary parallel ACS elements associated with parallel trellis decoding in accordance with various exemplary embodiments of the present invention.

FIG. 4 illustrates an exemplary parallel ACS circuit 400 constructed for implementation in, for example, an integrated circuit in a UWB receiver or receiver section such as the ACS branch metrics unit 110 described herein above. In the parallel ACS circuit 400, a series of parallel ACS elements from a first $ACS_0$ element 401 through a $(M-1)^{th}$ $ACS_2^{M-1}{}_{-1}$ element 402 can receive respective parallel path metric inputs $P_0(t-1)$ 411, $P_1(t-1)$ 412 and $P_2^M{}_{-2}(t-1)$ 421, $P_2^M{}_{-1}(t-1)$ 422. Each of the parallel ACS elements such as the $ACS_0$ element 401 and the $ACS_2^{M-1}{}_{-1}$ element 402, after computing branch metrics in the manner described above in connection with FIG. 3, generate parallel path outputs $P_0(t)$ 413, $P_2^{M-1}(t)$ 414 and $P_2^{M-1}{}_{-1}(t)$ 423, $P_2M(t)$ 424 which are shown schematically as an open form version of, for example, a butterfly connection. It will be appreciated that the exact configuration of the butterfly connection between ACS elements will depend on, for example, specific design factors such as the particular generator polynomials chosen for the convolutional code. However, it is contemplated that the diagram shown, for example, in FIG. 4, will encompass any such particular case so long as the general principles, concepts, conditions, and the like in accordance with various exemplary embodiments are met as discussed and described herein.

Figure 5:
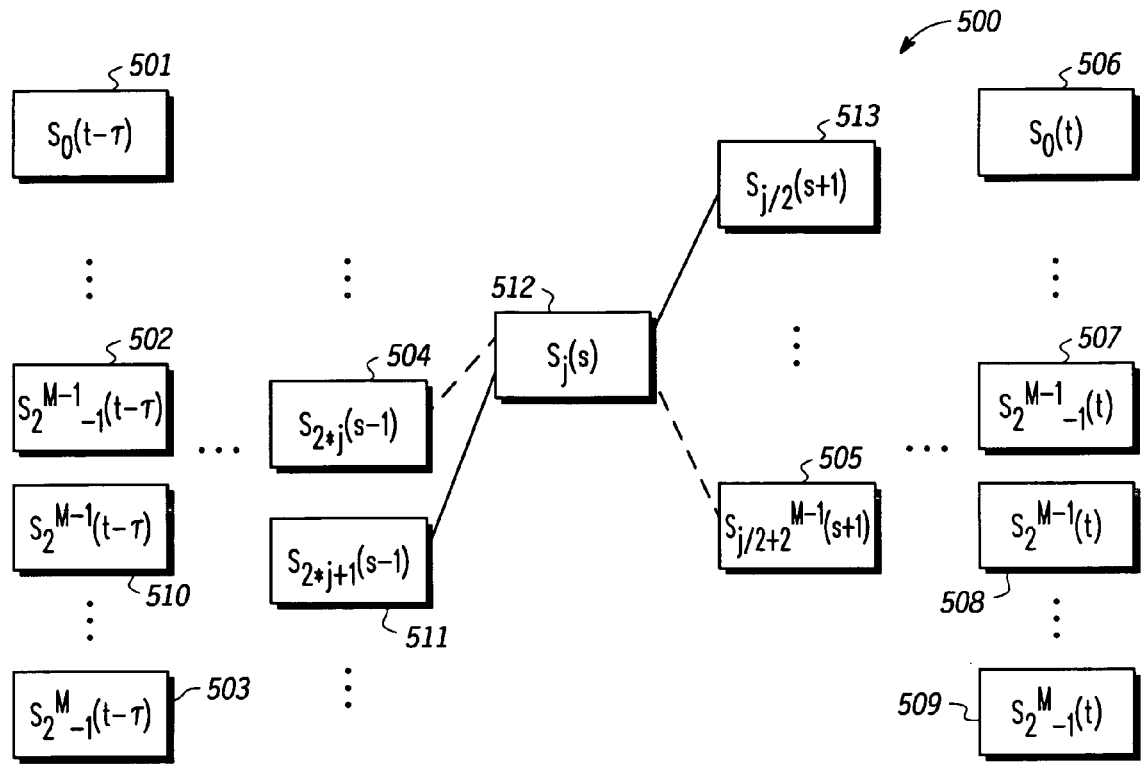
FIG. 5 is a diagram illustrating an exemplary trace back procedure associated with conventional trellis decoding.

As decoding results are generated in the form of, for example, surviving path metrics associated with each state of a decoder, the results can be stored as shown for example in FIG. 5, according to conventional methods in series of registers such as a register 501 through a register 513. At the end of a series of iterations associated with processing a message sequence, a trace back can be conducted whereby certain states are traversed based on the coded message symbols received. For example, in register 512 a value for state $S_j(s)$ is stored which can be arrived at from either a previous register 504 or 511 depending on whether the coded message symbol is a one as represented by, for example, a dashed line or a zero as represented by a solid line. Thus, from a previous state $S_{2*j}(s-1)$ represented by the contents of register 504, a one in the coded message sequence will result in a traversal to state $S_j(s)$ represented by the contents of register 512. Further, from a previous state $S_{2*j+1}(s-1)$ represented by the contents of register 511, a zero in the coded message sequence will result in a traversal to state $S_j(s)$ represented by the contents of register 512. From state $S_j(s)$, a zero in the coded message sequence will result in a traversal to state $S_{j/2}(S+1)$ represented by the contents of register 513 and a one in the coded message sequence will result in a traversal to state $S_{j/2+2^{M-1}}(s+1)$ in register 505. When the final stage of the trellis is reached as represented for example by register 506 through register 509, each possible path through the trellis is calculated and the path with the lowest metric is chosen as the surviving path and will also yield the decision as to the actual received symbol. Disadvantages are associated with the trace back method as noted, since it requires the entire n-stage trellis to be traversed prior to a decision being generated. Traversal of the trellis in such a manner requires computationally intensive operations such as performing separate ACS calculations for each stage.

Figure 6:
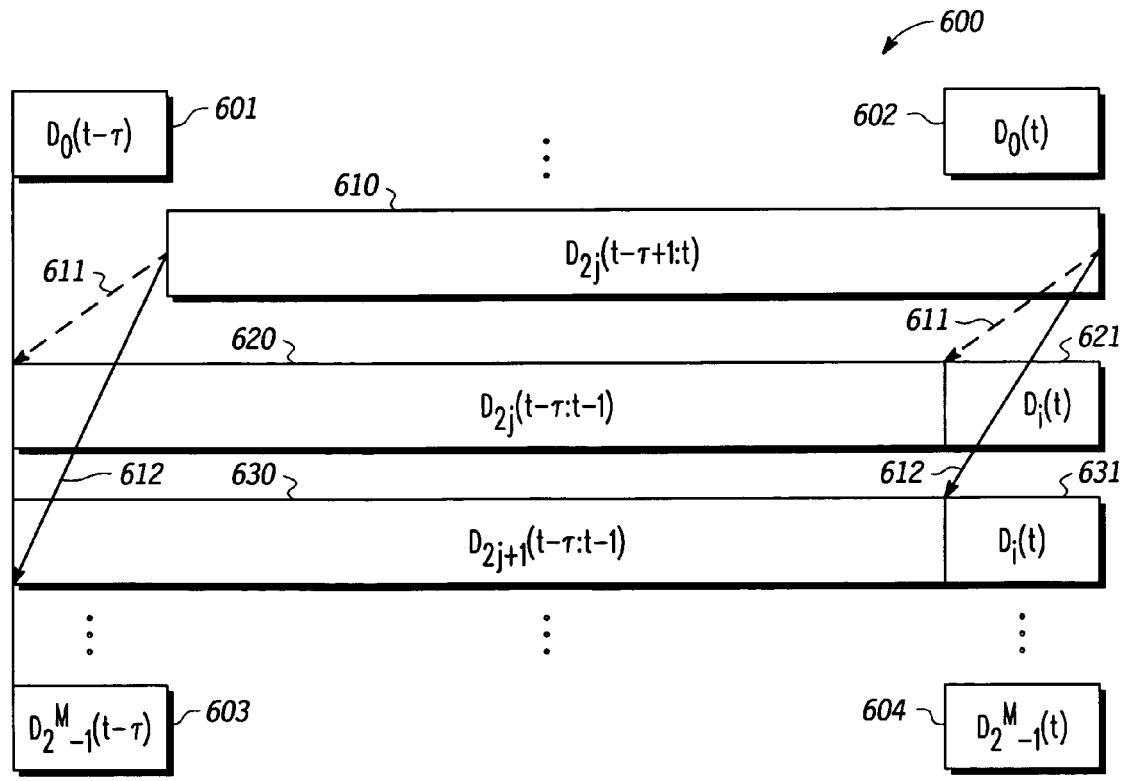
FIG. 6 is a diagram illustrating an exemplary track buffer in accordance with various exemplary embodiments of the present invention.

Accordingly, to avoid the noted disadvantages with conventional trace back methods, the track buffer 600, shown in FIG. 6, can be used to receive the results of the parallel connected ACS units associated with parallel ACS circuit 400 shown in FIG. 4. When results are generated from parallel connected ACS units in the form of path metrics, the path metric values can be stored in the track buffer 600 in registers such as exemplary registers 601-604 as will be described. As selection operations are generated through the operation of the parallel ASC circuit 400, such selections can be used to move or shift the contents in, for example, buffer 610. The accumulated path metric values can be pushed into buffer 620 or buffer 630 through register exchange depending on the value associated with the surviving path selection and, for example, the branch metric value with path 611 representing one of two possible values for the selection and path 612 representing the other of two possible values for the selection. The current selections for the corresponding registers are reflected in current register 621 or 631 depending on where the previous results were pushed. It will be appreciated that the track buffer will have a depth of τ which can be around 100 to around 150 representing the number of spin cycles for the track buffer to perform register exchange and the like. It should be noted that the clock rate for an exemplary processor in accordance with various embodiments, is 8.8 nanoseconds and further track buffer may be provided with a spin signal such as a clock signal, cycle signal, or the like at around the processor clock speed to allow the contents of the track buffer to be updated through register exchange or the like. While the track buffer depth τ represents a latency in the decision processing for the decoder, it is power efficient in that the buffer contents are exchanged as opposed to iterative and computationally intensive ACS calculations. In an additional step, the accumulated decisions may be voted on to arrive at the most likely decision symbol which is described in greater detail in the co-pending application noted above, entitled "DECISION VOTING IN A PARALLEL DECODER", and Ser. No. 11/024,803.

Figure 7:
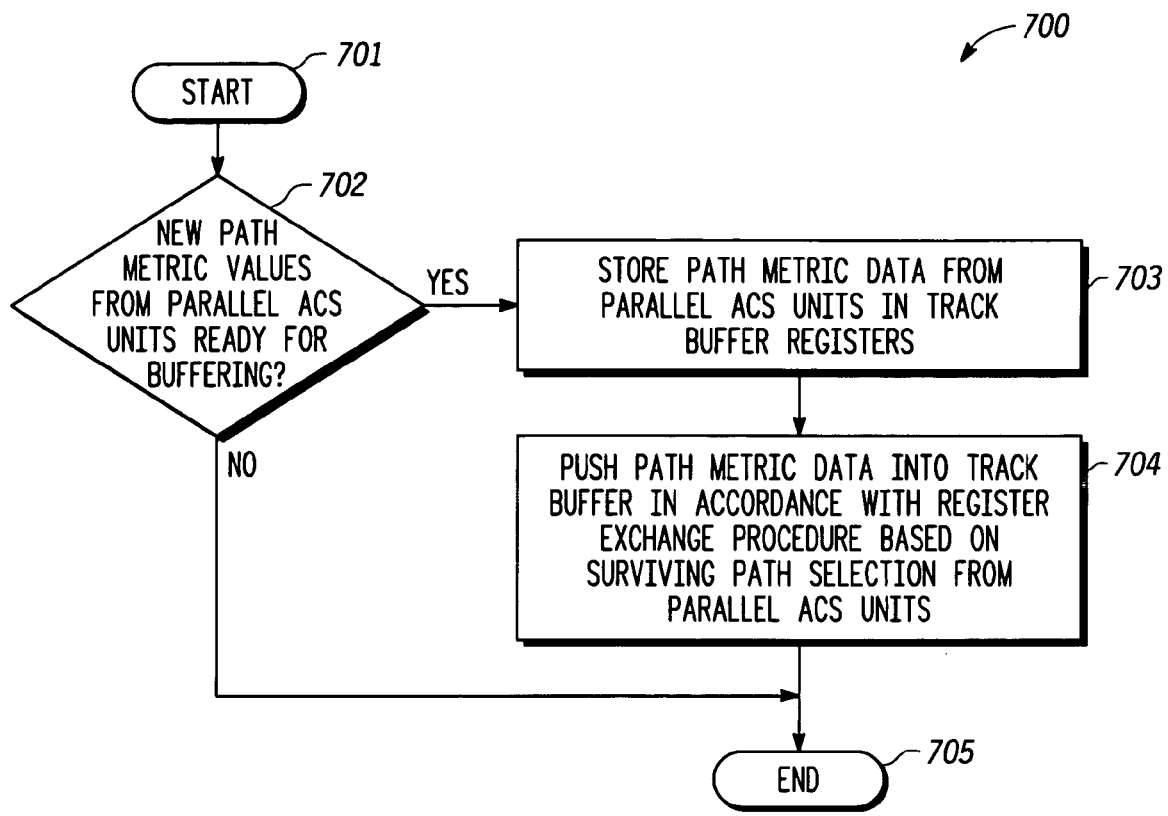
FIG. 7 is a flow chart illustrating exemplary procedures in accordance with various exemplary embodiments of the present invention.

It will be appreciated that in accordance with various exemplary embodiments, the present invention can be practiced as an exemplary procedure, such as procedure 700 as illustrated in FIG. 7. At start 701, it can be determined whether new path metric values, such as a path metrics, or the like, have been received from the parallel ACS units at 702. For illustrative purposes, in determining whether new path metric values, have been received, it will suffice that the new values associated will be available at the outputs of the exemplary ACS units as described hereinabove in accordance with a clock rate, cycle rate, or the like for the decoder. At 703, the path metric data such as the path metric values from the parallel connected ACS units can be stored in the track buffer and updated along the surviving path. Using the new path metric values which, as will be appreciated and as is described herein above, represent the $2^M$ path metric outputs from the parallel ACS units as described, the path metric data can be pushed into corresponding $2^M$ registers in the track buffer and updated along the surviving path in accordance with register exchange or the like whereupon a series of $2^M$ decisions may also be generated as to what the actual received symbol is at 704. Further, the decision data can be output to an exemplary voting block such as voting block 114 as described above. It should be noted that although at 705 the procedure is indicated as ending, it will be appreciated that a single "iteration" is shown for illustrative purposes. It is understood that the procedure in accordance with various exemplary embodiments, can continue to repeat, for example, as new path metric values are generated in parallel ACS circuit 400.

Track Buffer

Figure 8:
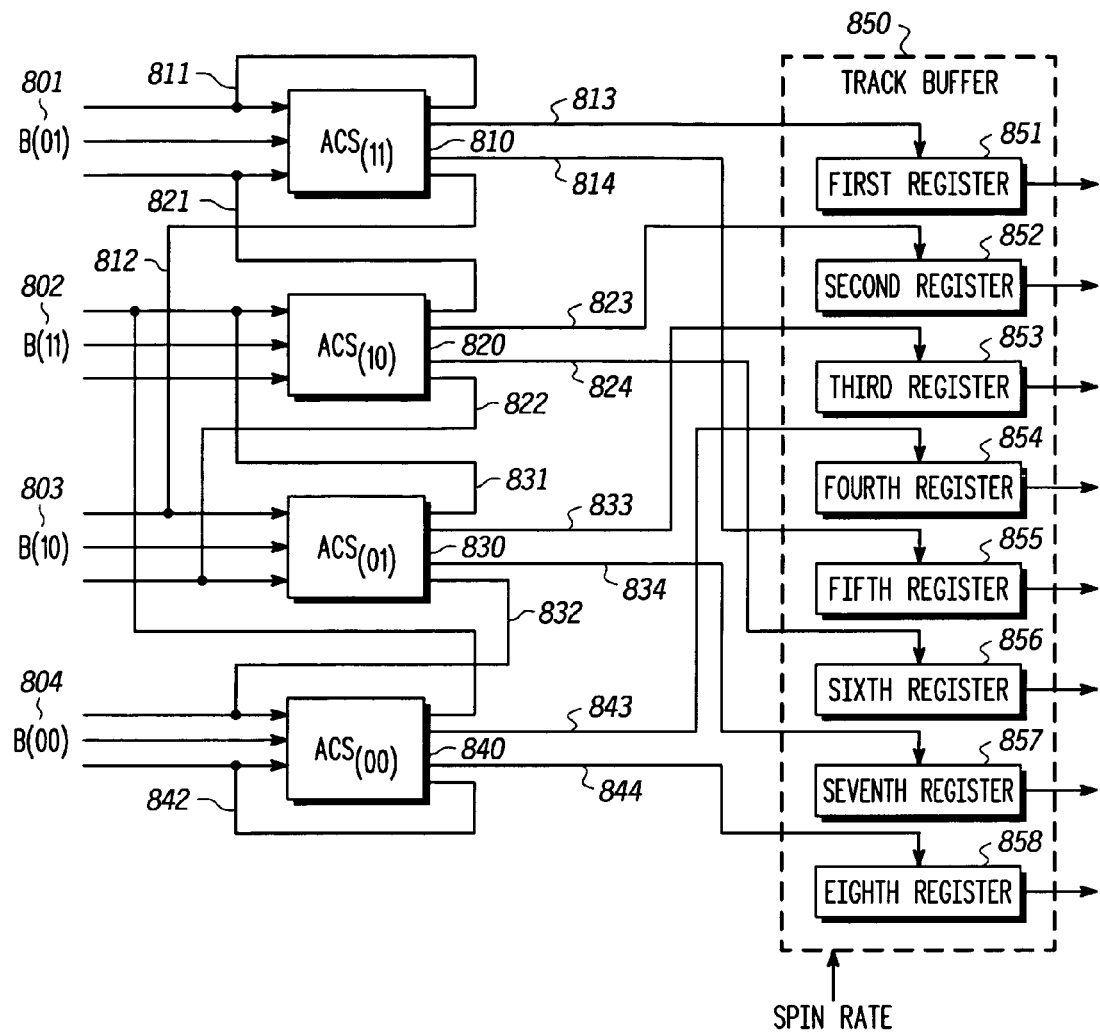
FIG. 8 is a block diagram illustrating exemplary parallel ACS elements associated with parallel trellis decoding of FIG. 4, connected in accordance with various exemplary parameters.

An exemplary decoder, for illustrative purposes, is shown in FIG. 8 for a value of M=3. Accordingly, $2^{M-1}$ or 4 ACS units, such as ACS unit$_{(11)}$ 810, ACS unit$_{(10)}$ 820, ACS unit$_{(01)}$ 830, ACS unit$_{(00)}$ 840, can be parallel, or butterfly connected according to, for example, the configuration as illustrated in FIG. 4 and the particular generator polynomial used for encoding, and can be used to provide decoding for an exemplary convolutional code with $2^M$ or 8 states. It will be appreciated that for various systems and codes, different values of M will result in a different number of ACS units. Further, different generator polynomials, for the same values of M, will result in different butterfly connections between parallel elements, such as ACS unit$_{(11)}$ 810, ACS unit$_{(10)}$ 820, ACS unit$_{(01)}$ 830, ACS unit$_{(00)}$ 840.

In order to calculate surviving path metrics, branch metric values $b_{(01)}$ 801, $b_{(11)}$ 802, $b_{(10)}$ 803, and $b_{(00)}$ 804, representing for example, the distance metric associated with the present received sequence r(t) and the respective possible sequences of the sequences in the soft decision constellation as will be appreciated by those of ordinary skill, are made available to the ACS units according to for example the relationships illustrated in accordance with FIG. 3 and as shown in FIG. 8. It will be appreciated that inputs to parallel ACS unit$_{(11)}$ 810, ACS unit$_{(10)}$ 820, ACS unit$_{(01)}$ 830, ACS unit$_{(00)}$ 840 can consist of feedback inputs 811, 812, 821, 822, 831, 832, 841, and 842, such as from the previous path metric values, branch metric values $b_{(01)}$ 801, $b_{(11)}$ 802, $b_{(10)}$ 803, and $b_{(00)}$ 804, and state inputs which may be loaded during decoder initialization and the like.

Each ACS unit 810-840 also produces two decision signals 813 & 814, 823 & 824, 833 & 834, or 843 & 844 that are used to control the operation of a track buffer 850. These decision signals 813, 814, 823, 824, 833, 834, 843, and 844 are Boolean signals that are indicative of which path metric was selected by the ACS unit 810-840.

The track buffer 850 includes eight registers 852, 852, 853, 854, 855, 856, 857, and 858 (i.e., twice the number of ACS units). Each of these registers accepts one of the decision signals 813, 814, 823, 824, 833, 834, 843, and 844 as an input that determine how it will manipulate stored values.

Figure 9:
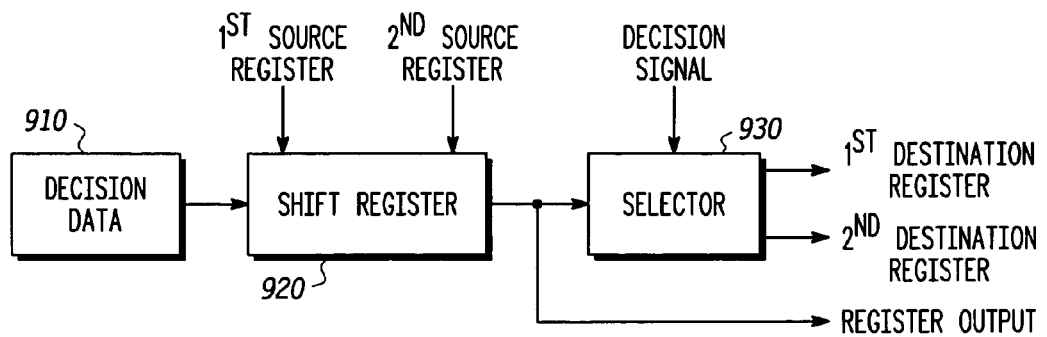
FIG. 9 shows an exemplary embodiment of a register from the track buffer of FIG. 8.

FIG. 9 shows an exemplary embodiment of a register from the track buffer. As shown in FIG. 9, the disclosed register includes a bit source 910, a shift register 920, and a selector 930.

The bit source 910 provides a constant input bit to the shift register, dependent upon its position. In the embodiment disclosed in FIG. 8, the bit source 910 for first through fourth registers 851-854 provides a bit value of "0," while the bit source for the fifth through eighth registers 855-858 provides a bit value if "1."

The shift register 920 receives the bit value from the bit source 910 and enters it into the least significant bit of the shift register 920. At this time the most significant bit is then shifted out of the shift register 920. The values stored in the shift register 920 are provided as a register output signal, and as an input to the selector 930. The shift register 920 also can have its entire set of values overwritten with the values stored in one of two source registers.

The length of the shift register 920 can be as long or as short as desired. In some embodiments it can be only a single bit register. In other embodiments, it can be larger. With longer shift registers 920, the values can be used to implement a voting scheme to reduce the time before final values are reached.

The selector 930 receives a register value from the shift register 920 and a respective decision signal 913, 914, 923, 924, 933, 934, 943, or 944 as an input. Based on the value of the decision signal 913, 914, 923, 924, 933, 934, 943, or 944, the selector 930 will copy the contents of the shift register 920 into one of two possible destination registers. Table 2 shows a set of destination and source registers for the embodiment disclosed in FIG. 8. The destination column indicates where the contents of the current shift register 920 are sent depending upon the value of the decision bit from the relevant decision signal 913, 914, 923, 924, 933, 934, 943, or 944 associated with the current shift register 920. The source column indicates where the contents of the current shift register 920 arrive from, depending upon the value of the decision bit associated with the source shift register 920.

TABLE 2

| Register | Source 1 | Source 2 | Decision Bit | Destination |
|---|---|---|---|---|
| First | First | Fifth | 0 | First |
|  |  |  | 1 | Second |
| Second | Second | Sixth | 0 | Third |
|  |  |  | 1 | Fourth |
| Third | Third | Seventh | 0 | Fifth |
|  |  |  | 1 | Sixth |
| Fourth | Fourth | Eighth | 0 | Seventh |
|  |  |  | 1 | Eighth |
| Fifth | First | Fifth | 0 | First |
|  |  |  | 1 | Second |
| Sixth | Second | Sixth | 0 | Third |
|  |  |  | 1 | Fourth |
| Seventh | Third | Seventh | 0 | Fifth |
|  |  |  | 1 | Sixth |
| Eighth | Fourth | Eighth | 0 | Seventh |
|  |  |  | 1 | Eighth |

In operation, for each iteration of the spin rate signal, each of the bit sources 910 will enter a new value into their respective shift register 920, the respective selectors 930 will then determine where the values from their associated shift register 920 will go based on the value of the respective decision signals, and then respective selectors 930 will transfer the newly-shifted register values to their proper destination shift registers 920. After a number of spins, the least significant bits from the first through eighth registers 851-858 will converge onto their final values.

Additional Modifications

As noted above, the present disclosure illustrates and describes an exemplary parallel trellis decoder with $2^{M-1}$ parallel ACS elements and a track buffer for use in a high-speed UWB environment. It will be appreciated that while various values for K and M have been described such as K=6 (M=5), and K=4 (M=3) for illustrative purposes for example, in the figures, different values of K can be used without departing from the invention. It will also be appreciated that the particular implementation of the decoder will be specific to the underlying convolutional code used, for example, to encode symbol sequences and, for a particular value of K, there may be many possible generator polynomials which can be used in an encoder to yield slightly different codes. However, use of $2^{M-1}$ parallel ACS units and corresponding track buffer is consistent with the present invention and any of the slight differences noted above resulting in, for example, slightly different connections can be considered to are intended to fall within the scope of the present invention.

CONCLUSIONS

The disclosed DS-UWB design provides scalable performance across a wide range of application requirements. This design leads to significant reductions in implementation complexity as compared to other proposed UWB PHY designs, while allowing increased scalability to high data-rate and low-power applications. This means that performance for applications such as high-rate data transfers for power-constrained handheld devices can significantly improved relative to current UWB PHY proposals. At the same time, the DS-UWB approach benefits from the significant benefits of true UWB operation, i.e., low fading in multipath, optimal interference characteristics, inherent frequency diversity and precision ranging capabilities.

Although this disclosure discusses a UWB device using the IEEE 802.15.3a standard by way of example, the general design is also applicable to other wireless networks, and should not be considered to be limited to application with respect to IEEE 802.15.3a networks. It should further be noted that while the present invention is applicable to trellis decoding in a UWB device which operates at different speeds and in different modes, the present invention should not be limited to any particular type of decoding operation, but can be used in any decoding situation where a convolutionally encoded symbol is present and for which its features would be advantageous.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. An integrated circuit capable of conducting a decoding operation on a received sequence of k symbols associated with an Ultra Wide Band (UWB) transmission, the received sequence presumed to include an encoded representation of a message sequence of n symbols encoded according to a convolutional code of rate n/k having a constraint K and having $2^M$ code states, where M is equal to K-1, the received sequence received according to a symbol rate associated with the message sequence, the integrated circuit comprising:
   $2^{M-1}$ parallel Add Compare Select (ACS) elements associated with the $2^M$ code states configured to generate $2^M$ path metric outputs; and
   a track buffer including $2^M$ path registers configured to be capable of storing the $2^M$ path metric outputs from the $2^{M-1}$ parallel Add Compare Select (ACS) elements.

2. An integrated circuit, as recited in claim 1, wherein:
   the $2^{M-1}$ parallel ACS elements are further configured to generate selected ones of the $2^M$ path metric outputs as surviving path metrics; and
   the selected ones are used to update the contents of the track buffer such that ones of the $2^M$ path registers are updated in accordance with Register Exchange.

3. An integrated circuit, as recited in claim 1, wherein the decoding operation includes one of a maximum likelihood (ML) decoding operation and a maximum a posteriori (MAP) decoding operation.

4. An integrated circuit, as recited in claim 1, wherein the track buffer includes a buffer depth of from around 100 to around 150.

5. An integrated circuit, as recited in claim 1, wherein K=6.

6. A method for decoding a received sequence of k symbols associated with an Ultra Wide Band (UWB) transmission, the received sequence presumed to include an encoded representation of a message sequence of n symbols encoded according to a convolutional code of rate n/k having a constraint K and having $2^M$ code states, where M is equal to K-1, the sequence received according to a symbol rate, the method comprising:
   performing, substantially in parallel, $2^{M-1}$ Add Compare Select (ACS) operations associated with the $2^M$ code states and generating $2^M$ path metric outputs; and
   storing the $2^M$ path metric outputs in $2^M$ corresponding path registers.

7. A method of decoding, as recited in claim 6, further comprising:
   generating from the $2^{M-1}$ parallel ACS operations selected ones of the $2^M$ path metric outputs as surviving path metrics; and
   updating the contents of the $2^M$ path registers such that ones of the $2^M$ path registers are updated in accordance with a Register Exchange operation using the selected ones.

8. A method, as recited in claim 7, wherein the $2^M$ path registers includes a depth of from around 100 to around 150.

9. A method, as recited in claim 7, further comprising performing the Register Exchange operation from around 100 to around 150 times.

10. A method, as recited in claim 6, wherein K=6.

11. A method, as recited in claim 6, wherein the decoding includes one of a maximum likelihood (ML) decoding and a maximum a posteriori (MAP) decoding.

12. An apparatus configured to be capable of conducting a decoding operation on received sequence of k symbols associated with an Ultra Wide Band (UWB) transmission, the received sequence presumed to include an encoded representation of a message sequence of n symbols encoded according to a convolutional code of rate n/k, the convolutional code having a constraint K and having $2^M$ code states, where M=K-1, the apparatus comprising:
   a memory, and
   a processor coupled to the memory, the processor configured to:
      input the received sequence according to a symbol rate associated with the message sequence;
      perform, substantially in parallel, $2^{M-1}$ Add Compare Select (ACS) operations associated with the $2^M$ code states to generate $2^M$ path metric outputs; and
      store the $2^M$ path metric outputs generated from the $2^M$ ACS operations in the memory.

13. An apparatus, as recited in claim 12, wherein the memory further includes a track buffer having $2^M$ path registers, and wherein the processor, in the storing the $2^M$ path metric outputs generated from the $2^M$ ACS operations, is further configured to store data in the $2^M$ path registers based on $2^M$ control signals generated from the $2^M$ ACS operations.

14. An apparatus, as recited in claim 13, wherein the processor is further configured to:
   generate from the $2^{M-1}$ parallel ACS operations selected ones of the $2^M$ path metric outputs as surviving path metrics; and
   update the contents of the $2^M$ path registers such that ones of the $2^M$ path registers are updated in accordance with a Register Exchange operation using the selected ones.

15. An apparatus, as recited in claim 13, wherein at the symbol rate each of the $2^M$ path registers is a shift register.

16. An apparatus, as recited in claim 15, wherein at the symbol rate each of the $2^M$ path registers in the track buffer has a bit value shifted in and has its new contents copied to one of two of the $2^M$ path registers based on one of the $2^M$ control signals generated from the $2^M$ ACS operations.

* * * * *